US006933713B2

(12) United States Patent
Cannon

(10) Patent No.: US 6,933,713 B2
(45) Date of Patent: Aug. 23, 2005

(54) HIGH BANDWIDTH OSCILLOSCOPE PROBE WITH REPLACEABLE CABLE

(75) Inventor: James E. Cannon, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 18 days.

(21) Appl. No.: 10/764,909

(22) Filed: Jan. 26, 2004

(65) Prior Publication Data

US 2005/0162147 A1 Jul. 28, 2005

(51) Int. Cl.[7] .......................... G01R 31/02; H01R 9/05
(52) U.S. Cl. ..................................... 324/72.5; 439/578
(58) Field of Search ........................ 324/72.5, 72, 437,
324/445, 446, 449, 149, 538, 690, 696, 715,
324/724, 751, 752, 754, 755, 757, 758, 156,
324/115, 133, 121 R; 439/551, 578, 579,
439/584, 675

(56) References Cited

U.S. PATENT DOCUMENTS

| | | | | |
|---|---|---|---|---|
| 4,708,661 A | * | 11/1987 | Morland et al. | 439/77 |
| 5,857,866 A | * | 1/1999 | Felps | 439/289 |
| 6,305,963 B1 | * | 10/2001 | Felps | 439/317 |
| 6,517,359 B1 | * | 2/2003 | Felps et al. | 439/63 |
| 6,602,093 B1 | * | 8/2003 | Cannon | 439/578 |
| 6,783,382 B2 | * | 8/2004 | Felps | 439/314 |
| 6,790,080 B2 | * | 9/2004 | Cannon | 439/551 |
| 6,808,407 B1 | * | 10/2004 | Cannon | 439/314 |
| 2003/0173944 A1 | * | 9/2003 | Cannon | 324/72.5 |
| 2003/0193323 A1 | * | 10/2003 | McTigue | 324/72.5 |
| 2004/0189276 A1 | * | 9/2004 | Cannon | 324/72.5 |

* cited by examiner

Primary Examiner—Anjan Deb
Assistant Examiner—Hoai-An D. Nguyen
(74) Attorney, Agent, or Firm—Edward L. Miller

(57) ABSTRACT

A probe pod housing is connected by a cable to an active probe. The probe pod housing carries a male push-on precision BNC connector that is also a cross-series adapter. The center conductor of the cable receives a male connector that then mates with the non-BNC end of the cross-series adapter. Auxiliary conductors that may also be carried by the cable are connected to male pins (soldered to a circuit board carried within the probe pod) with a push-on female in-line connector. The active probe itself uses a soldered-to-the-shield threaded nut technique. The nut threads into a metallic body that contains the impedance converter and that is enclosed by the body of the active probe. The cable is replaced by first unsoldering the center conductor (and also any auxiliary conductors). Then the nut (which is still soldered to the shield) is unscrewed from the metallic body, and the cable is free from the probe. At the probe pod end the cable mounted male connector is simply unscrewed from the cross-series adapter, and any auxiliary conductors disconnected by removing the female wire-mounted in-line connector.

12 Claims, 5 Drawing Sheets

HIGH BANDWIDTH OSCILLOSCOPE PROBE WITH REPLACEABLE CABLE

REFERENCE TO RELATED APPLICATIONS

The subject matter of this disclosure is related to, and makes use of, that which is disclosed in U.S. patent application Ser. No. 10/764,928 entitled POSITIVE LOCKING PUSH-ON PRECISION BNC CONNECTOR FOR AN OSCILLOSCOPE PROBE, filed 26 Jan. 2004 by James E. Cannon and assigned to Agilent Technologies of Palo Alto, Calif. Because of the similarity in subject matter, and for the sake of brevity in the present case, that US Patent Application is hereby expressly incorporated herein by reference, and will be referred to as "POSITIVE LOCKING PUSH-ON PRECISION BNC CONNECTOR".

The above incorporated Application itself incorporates U.S. Pat. No. 6,609,925, issued 26 Aug. 2003, entitled PRECISION BNC CONNECTOR, filed 30 Apr. 2002 by James E. Cannon and assigned to Agilent Technologies of Palo Alto, Calif., which for that reason, is also hereby expressly incorporated herein by reference, and will be referred to as "PRECISION BNC CONNECTOR" or as "the incorporated '925 patent".

The subject matter of this disclosure is also related to, and makes use of, that which is disclosed in U.S. patent application Ser. No. 10/395,989 entitled SYSTEMS AND METHODS FOR MAKING A HIGH-BANDWIDTH COAXIAL CABLE CONNECTION, filed 24 Mar. 2003 by James E. Cannon and assigned to Agilent Technologies of Palo Alto, Calif. Because of the similarity in subject matter, and for the sake of brevity in the present case, U.S. patent application Ser. No. 10/395,989 is hereby expressly incorporated herein by reference, and will be referred to as "HIGH-BANDWIDTH COAXIAL CABLE CONNECTION" or as "the incorporated '989 application".

BACKGROUND OF THE INVENTION

The present invention concerns high frequency test equipment where a detachable probe is connected to that equipment. One example is a present day high performance oscilloscope having an active probe, although it will be readily understood that such an oscilloscope or an active probe are just examples of such equipment. Let us consider the oscilloscope/active probe combination, appreciating that much or all of what we are about to say also applies to other examples.

The active probe is, as a complete assembly, a fairly expensive item. It often has a housing at each end of a flexible cable that includes not only a coaxial transmission line but several (six to eight is common) other auxiliary conductors. Despite the rather particular nature of the cable (an actual one it is apt to be quite specific to its application, although not necessarily, as it could be just a simple length of coax . . . ), it is probably not the most expensive sub-assembly in the overall probe assembly. Other sub-assemblies having the "active ingredients" are likely to warrant that distinction, and these would be found in housings located at one or both ends of the cable. The cable, however, it exposed to, and is susceptible to, forms of mechanical abuse that the stuff in the housings is better able to withstand, owing to the more rugged mechanical nature of the housing.

The disasters that can befall the cable run the gamut from the mundane to the bizarre. Its sheath can be abraded to expose the conductors, or it can be accidentally cut, or be burned with a soldering iron. Destruction often comes from unforeseeable directions: the lab's pet ferret is on the loose, and no self-respecting ferret can resist chewing on a cable.

Sometimes the insult to the cable is less obvious: it got caught in a drawer that was slammed shut, or was rolled over by the caster of an occupied swivel chair. Sometimes cables get pinched under the foot of a heavy instrument during the movement of equipment. The cable looks intact, and is perhaps just a little bruised, so to speak. But now newly measured results that used to be fine are suddenly wrong, for no apparent reason. What has happened, of course, is that the coaxial part of the cable is really a transmission line, and not just a shielded conductor. A transmission line has a characteristic impedance, and at high frequencies, particularly above 1 GHz, any abrupt change in characteristic impedance within a transmission line system will create reflections. An active probe is typically composed of an impedance converter at the probe tip that has a 50Ω output impedance that then drives a 50Ω transmission line (our cable) that in turn is coupled to a 50Ω receiver in the test equipment. Reflections owing to mismatches in the characteristic impedance show up as frequency dependent errors in accuracy. These effects can be quite convoluted when considered in the time domain for complex digital waveforms: observed waveform shape can become distorted such that it scarcely resembles the actual waveform.

What happens, of course, is that the characteristic impedance of a coaxial (or any other) transmission line is as much a function of its dimensions and shape as it is of things like the dielectric constant of the insulating medium separating the conductors. A squashed transmission line is a sick transmission line, and it is very possible that it cannot be "massaged" back to life, even if it is known or determined where the insult occurred. Readers fortunate enough to have access to a TDR (Time Domain Reflectometer) can observe this directly by viewing the trace for a length of sacrificial coax (e.g., RG-58) while crimping an abrupt U-shaped bend between the thumb and fingers (or even better, with a pair of pliers). A very pronounced reflection will be observed at a location in the trace corresponding to distressed portion of the cable.

The significance of all this is, and it is confirmed by the repairs performed by equipment manufacturers, that the cables on high performance probes are frequently in need of repair. Conventional manufacturing techniques are such that the cable is not a user or owner replaceable item. If the cable has been ruined, then the whole probe has to go in for repair, often at considerable expense and no small amount of time out of service. One manufacturer of high-end 'scope probes even has a "loner probe" program to keep a customer up and running while his probe gets an overhaul. While it is true that every so often the true electronic part of a probe gets static zapped or otherwise smoked, a significant portion of this repair activity involves simply replacing a defective cable.

It would be desirable to make the cable more easily replaceable. To be sure, one has to have on hand the correct cable. But with a conventional probe, even having that does not allow its successful installation. It is often the case that prior art cables were attached with crimped ferrules applied over a shield whose center conductor enters a hollow tang. Getting the crimped ferrule off without damaging the tang is a dicey operation; sometimes the sub-assembly bearing the tang is fatally damaged during an attempt to remove the crimped ferrule.

The incorporated '989 application has addressed a portion of this issue, and we will summarize that solution in due course. In brief, it involves replacing the crimp against the shield with a threaded nut soldered to the shield. It is used in the probe proper, and is appropriate in that setting owing to the confined space within a small probe assembly.

The solution shown in the '989 application involves unsoldering the center conductor. That is not a problem in the probe, as the solder joint in question is at the very origin of the transmission line (which, after all, has to start somewhere). But at the other end of the cable we often find a probe pod for push-on attachment to a 'scope, and it is most definitely not the terminal end of the transmission line! Any solder joints to center conductors are viewed with grave suspicion, as there is still some significant amount of transmission line to go (including precision RF connection at the front panel of the 'scope) before the terminating input impedance of the receiver is reached. Indeed, one of the principal functions of the probe pod assembly is to hold a precision RF connector for connection to the front panel of the 'scope. Yet we now need to make the cable easily detachable from the probe pod, so that the cable is indeed replaceable, even in the field by an operator of the 'scope or other maintenance technician not located at a depot level repair facility. What to do?

SUMMARY OF THE INVENTION

A probe pod housing is connected by a cable to an active probe. The probe pod housing carries a male push-on precision BNC connector (for connection to an instrument front panel) that is also a cross-series adapter to SMA or APC 3.5. The center conductor of the cable receives an SMA or APC 3.5 male connector that then mates with the non-BNC end of the cross-series adapter. Auxiliary conductors that may also be carried by the cable are connected to male pins (soldered to a circuit board carried within the probe pod) with a push-on female in-line connector. The active probe itself uses the soldered-to-the-shield threaded nut technique of the '898 application. The nut threads into a metallic body that contains the impedance converter and that is enclosed by the body of the active probe. The cable is replaced by first unsoldering the center conductor (and also any auxiliary conductors) in the active probe. This requires care, but is not fraught with undue risk. Then the nut (which is still soldered to the shield) is unscrewed from the metallic body, and the cable is free from the probe. At the probe pod end the cable mounted male connector is simply unscrewed from the cross-series adapter, and any auxiliary conductors disconnected by removing the female wire-mounted in-line connector.

DESCRIPTION OF A PREFERRED EMBODIMENT

Figure 1:
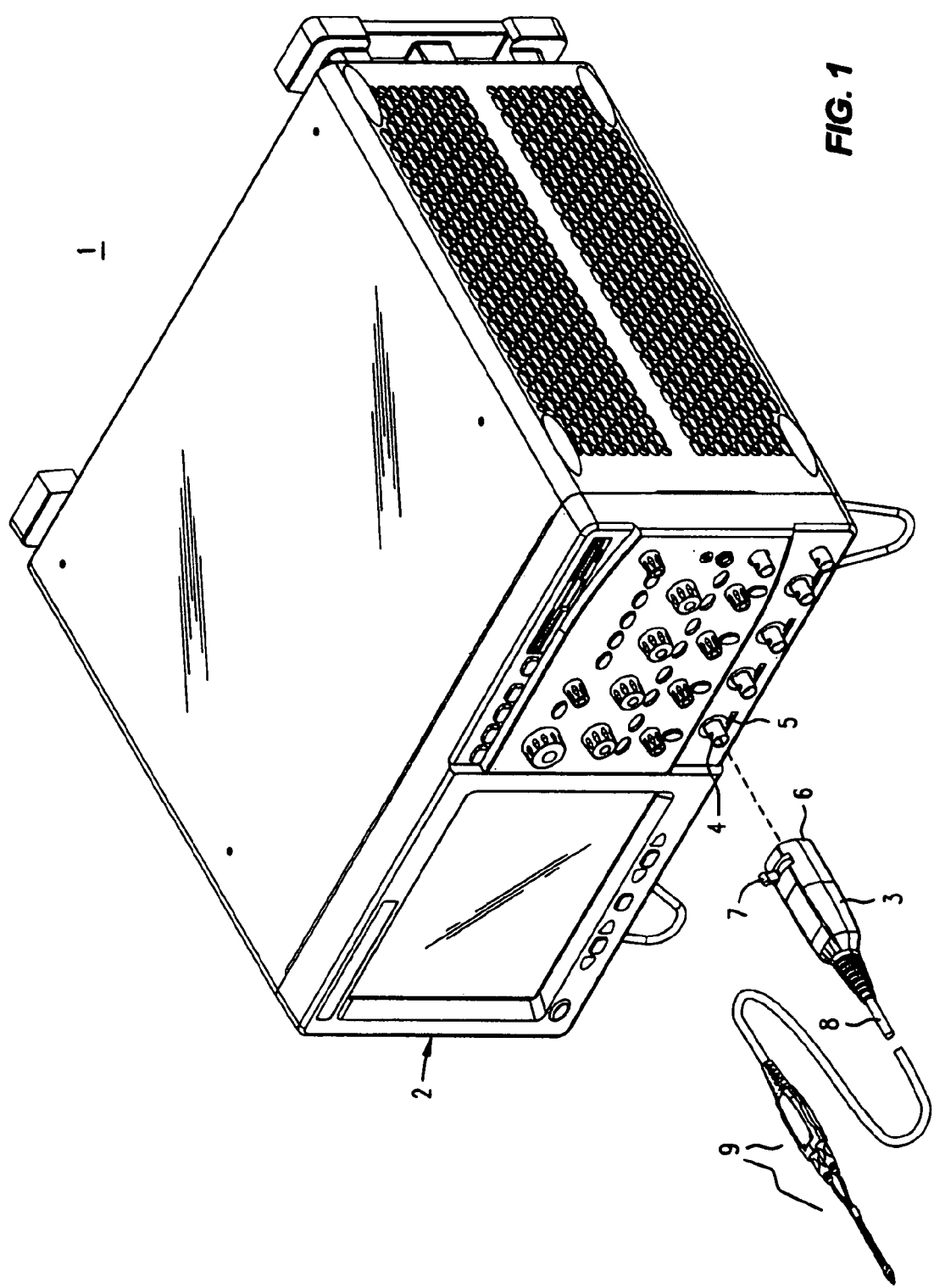
FIG. 1 is a front perspective view of a positive locking push-on BNC connector mechanism for an active probe that attaches to an oscilloscope and that has an easily replaceable cable.

Refer now to FIG. 1, wherein is shown a front perspective view 1 of an electronic instrument 2, such as a digital oscilloscope, having one or more front panel female BNC connectors 4 that receive a positive locking push-on precision male BNC connector assembly 3 (pod housing), say, in support of operation with an active probe 9 connected at a distal end of a cable 8. In a manner similar to that explained in the incorporated POSITIVE LOCKING PUSH-ON PRECISION BNC CONNECTOR, the positive locking push-on precision BNC connector pod housing is installed by first lining it up and then pushing it toward the 'scope. That engages the BNC detents, and a simple motion with the thumb against the lever 7 performs a positive locking that fully and forcefully mates the two BNC connector halves. When the pod housing 3 is locked, not only is a precision BNC connection established with connector 4, but a row of spring loaded pins 6 (not visible) on the front of the housing for the push-on assembly 3 engages a row 5 of contacts beneath the connector 4. To remove the positive locking push-on precision BNC connector the operator pushes in the opposite direction on lever or tab 7 with a thumb or a finger, while pulling the assembly (3) away from the 'scope.

Figure 2:
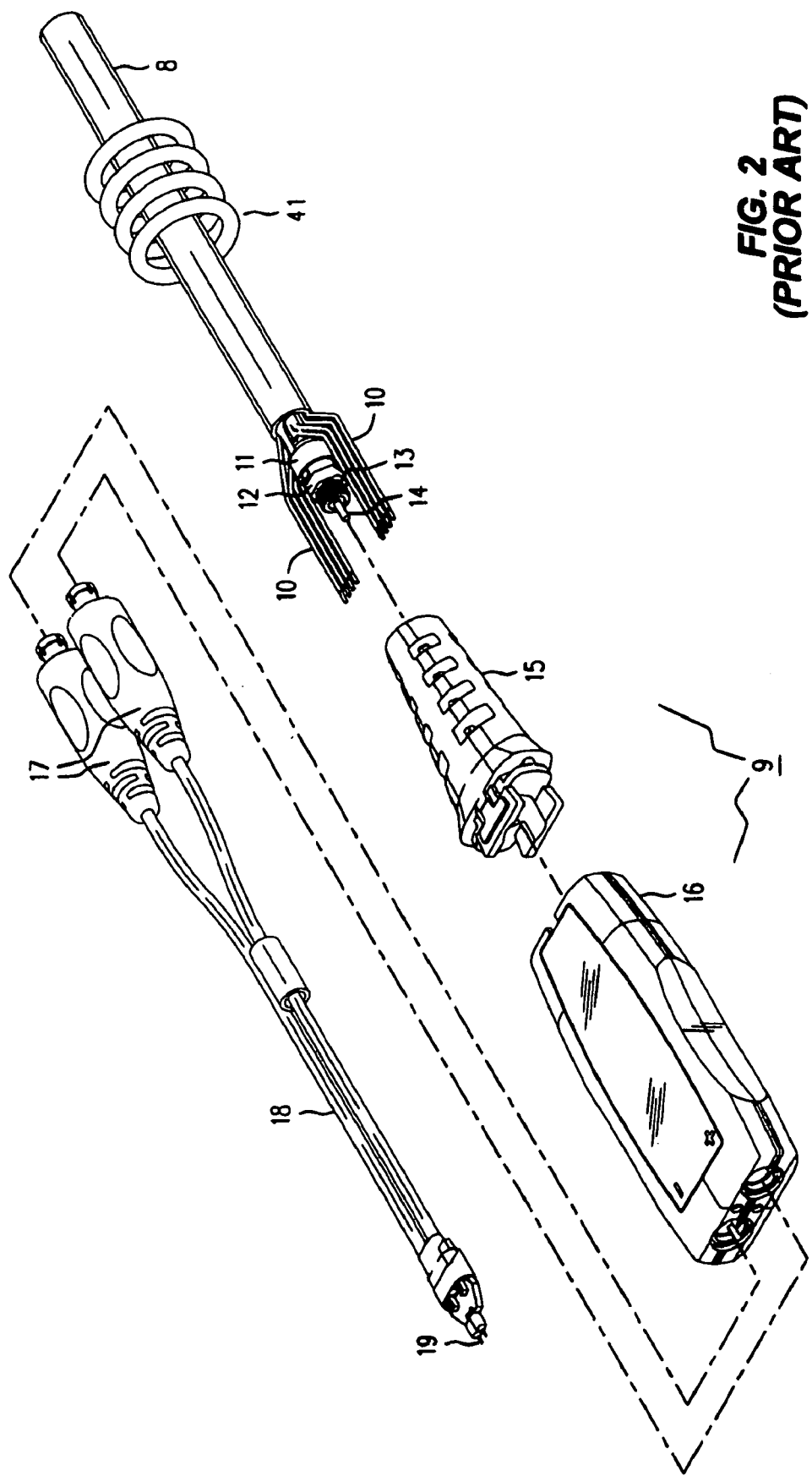
FIG. 2 is an exploded perspective view of the active probe of FIG. 1.

Refer now to FIG. 2, wherein is shown a perspective exploded view of the active probe 9 of FIG. 1. The active probe has a body 16 that carries a strain relief/boot 15. Anchored to the body and supported by the boot is the cable 8. Colored rings 41 can be re-arranged and pushed past each other onto slots in the boot for probe identification. At the other end of the active probe is a probe tip assembly. In this particular example the probe is a differential probe and the probe tip assembly comprises a removable and flexible two conductor assembly having an actual pair of pins 19 carried by a pair of insulated wires 18. A pair of connectors 17 (e.g., of type SMP) connect the probe tip assembly to the body 16.

Now consider the cable 8 and how it is connected to the active probe 9. The cable 8 has at its center a center conductor 14 covered by a cylindrical dielectric sheath, about which is woven or wound a flexible tubular conductive sleeve. The center conductor and its conductive sleeve form a coaxial transmission line of controlled characteristic impedance (e.g., 50Ω). Disposed about the outside of the tubular sleeve, but inside an outer woven shield, are the six to eight auxiliary conductors 10. On the outside of the outer woven shield is a suitable plastic or rubber covering.

A threaded ferrule (12, 13) has a central bore therethrough through which the center conductor 14 and its dielectric sheath may pass. The tubular conductive sleeve passes over a tang (not shown, and which has the bore receiving the center conductor and its dielectric sheath) and under an annular ring 11, after which the ring 11 is pinched and the conductive sleeve is soldered to the tang of the threaded ferrule.

Figure 3:
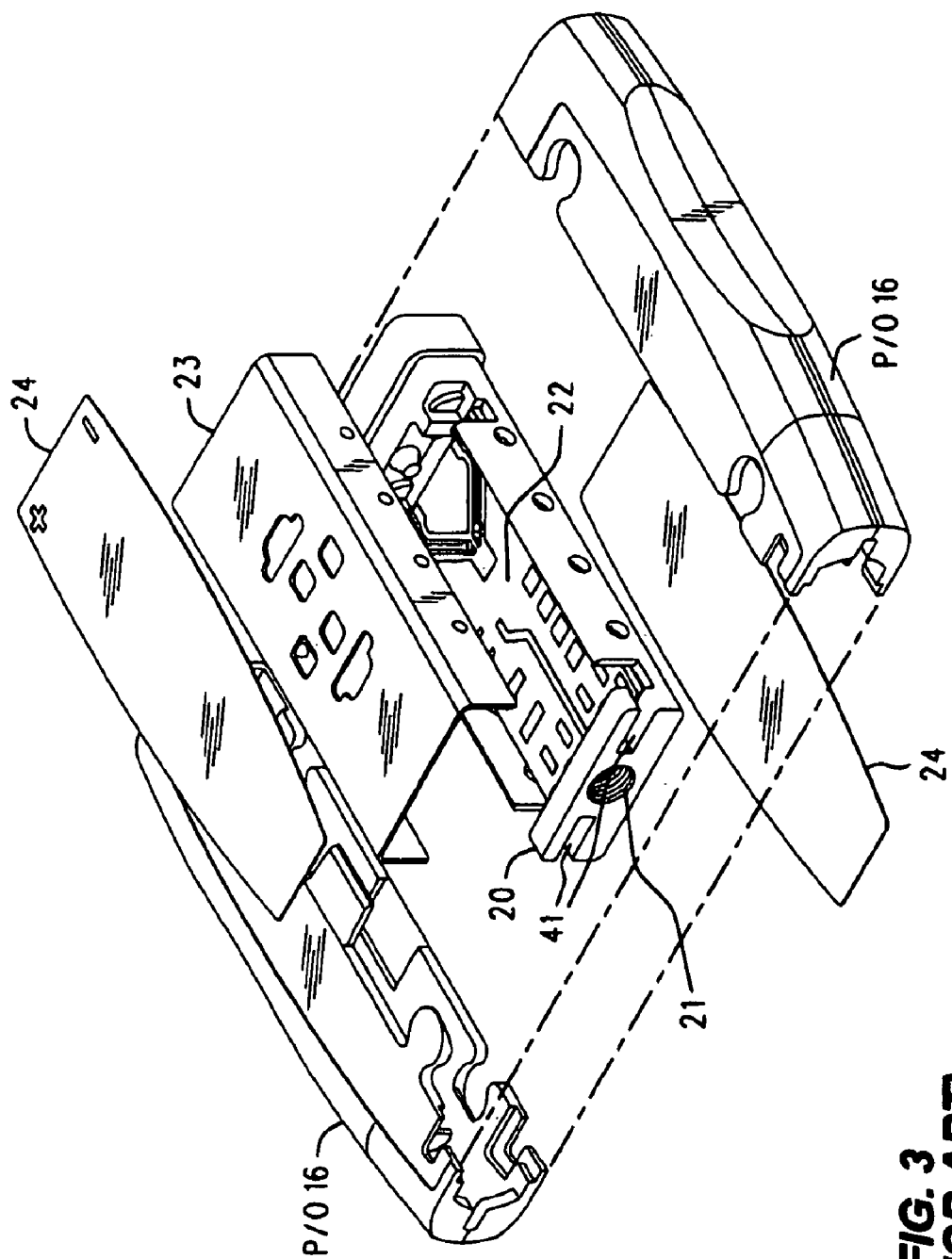
FIG. 3 is a more detailed exploded perspective view of a portion of the active probe of FIG. 2.

Now refer to FIG. 3 to see how the prepared cable 8 is attached to the body of the probe 9. In that figure (which views the probe from the other, or cable 8 end) a pair of adhesive labels 24 has been removed, revealing that the housing 16 is actually two identical halves that are held together by various tabs and interlocking tab sockets. The housing 16 encloses a small chassis having a cover 23 and a circuit assembly 22. The rear of the chassis has a "rear panel" 20 having therein a threaded hole 21 and some adjacent slots 41. The threaded portion 13 of the soldered on ferrule of FIG. 2 is threaded into the threaded hole 21, tightened, and the auxiliary conductors 10 routed through the slots 41. The center conductor 14 and the auxiliary conductors are then soldered to the circuit assembly 22. The soldered-to-the-shield threaded connector just described is small and affords good strain relief. Nevertheless, it will be appreciated that, insofar as replaceability of the probe or cable is concerned, another RF connector, perhaps not even threaded, could be used in other applications.

To remove the cable 8 from the active probe 9 the circuit board 22 is exposed, the conductors 14 and 10 are unsoldered, and the threaded ferrule unscrewed. A new cable 8 is installed on an existing probe 9, or a new probe on an existing cable, by reversing the steps.

The reader is reminded that the subject matter of FIGS. 2 and 3 is set out in the incorporated '989 application. Further details about that subject matter can be found therein.

Figure 4:
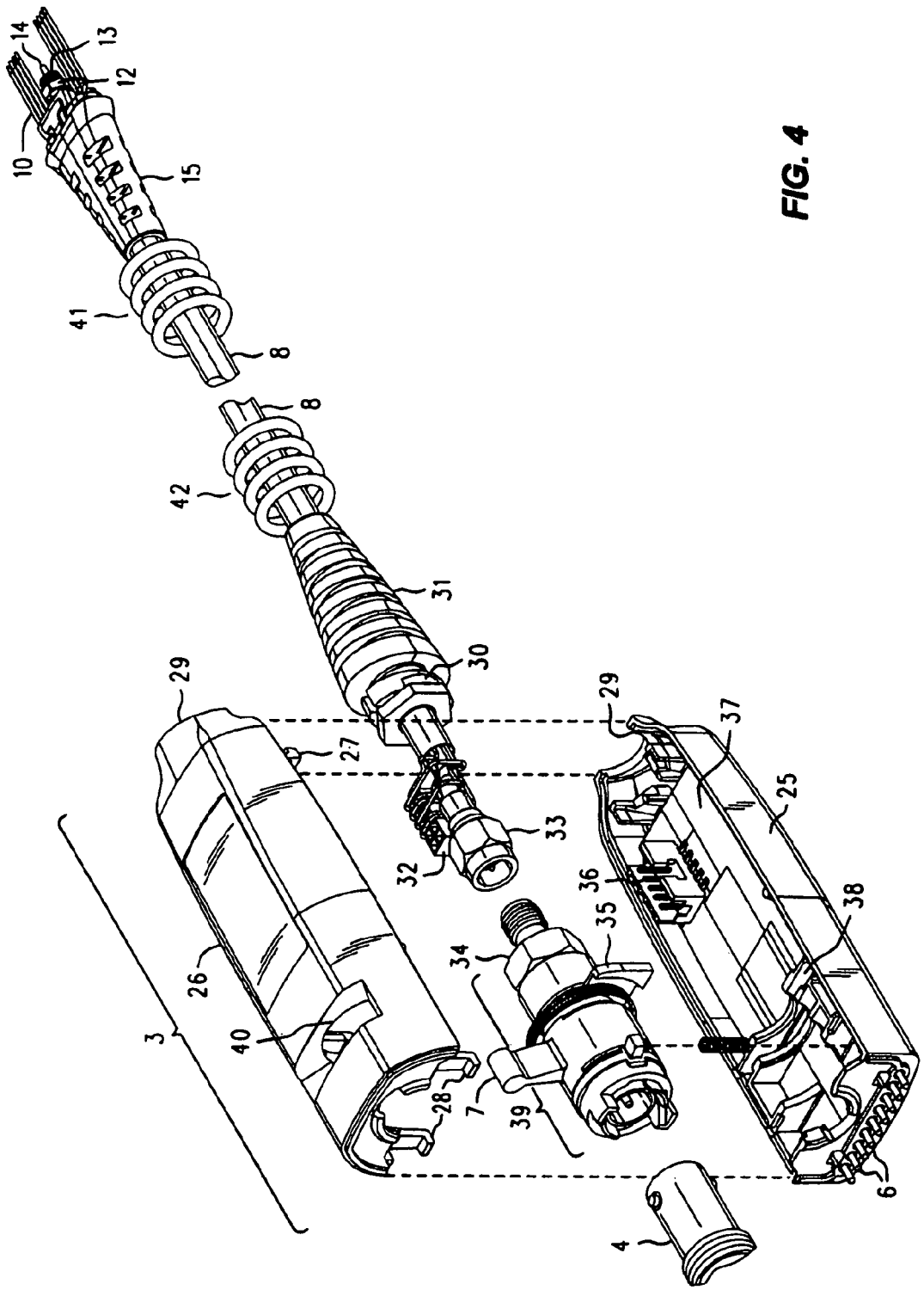
FIG. 4 is an exploded perspective view of the positive locking push-on precision BNC connector mechanism shown in FIG. 1.

Refer now to FIG. 4, wherein is shown an exploded view of the housing 3 of FIG. 1 and its contents. In particular, an upper housing half 26 and a lower housing half 25 cooperate to contain a locking self-latching BNC latch assembly 39, a female RF connector assembly 34 (e.g. using APC 3.5) for connection with a cable 8 that has a probe at a distal end. (We have not shown the entire active probe 9 itself, only the boot 15 and the conductors 14 and 10 that attach to it.) The cable 8 connects to connector assembly 34 through its own male connector 33. The cable 8 is further anchored in the housing by the action of a strain relieving boot 31 that is affixed to the cable and that has a narrow neck 30 that is made captive in an aperture (29) in the rear of the housing. Also shown are two sets of flexible colored rubber rings 41 and 42 that can be passed by each other to reside upon grooves in the boots. These colored rings serve as reconfigurable probe identifiers, as mentioned in connection with FIG. 2.

In addition to the coaxial transmission line in the cable 8, there are the six to eight other conductors 14 that are part of cable 8, and these are connected to a circuit board 37 in housing half 25 through connectors 32 and 36. The function of these six to eight conductors varies with the model of the probe, and is connected with the function of the row of spring loaded pins 6. Besides power, power return and bias voltages, there are also items of information that are passed by these conductors, such as model numbers, calibration information and serial numbers.

A locking self-latching BNC latch assembly 39 is held in place by a pair of wings 35 (only one of which is visible in FIG. 4) that become captive in a slot 38 in the lower housing half 25. A similar slot (not visible) exists in the upper housing-half 26. These slots are sized to contain the wings 35 with essentially no remaining free motion. The internal operation of the self-latching BNC latch assembly 39 is fully described in the incorporated POSITIVE LOCKING PUSH-ON PRECISION BNC CONNECTOR, and need not concern us further here.

To conclude our description of FIG. 4, note the slot 40 in the upper housing half 26. It allows the lever 7 to extend outside the housing so that it can be actuated by the operator. And finally, note also the hooks 27 and flexible catches 28. Hooks 27 of the upper housing half 26 act as hinges, and engage suitable corresponding recesses (not shown) in the lower housing half 25. Flexible latches 28 of the upper housing engage recessed stepped apertures (not shown) in the bottom of the lower housing half, and snap forward over the steps to hold the two housing halves together. To separate the housing halves, a suitable tool (e.g., the jaws of an open pair of dainty long nose pliers, or the points of a pair of draftsman's dividers) is inserted into the recessed stepped apertures and pressure is applied to move the angled portions of the flexible catches 28 away from the steps. Then the housing halves 25 and 26 are unhinged and separated.

Now note female connector 34 on the back end of the locking self-latching BNC latch assembly 39. In one particular instance it is preferred that it be an APC 3.5 connector, although other connector styles are, or may become, suitable. (For example, the RF connector might not be threaded.) In essence, the female connector 34 makes the locking self-latching BNC latch assembly 39 function as a cross-series adapter.

Male connector 33 mates with female connector 34. To replace the cable 8 the housing halves are opened, connector 33 is un-mated from connector 34 by turning the shell of connector 33, and connector 32 is pulled away from connector 36. To install a new cable on the probe assembly 3, or a new probe assembly on an existing cable 8, the steps are reversed.

Figure 5:
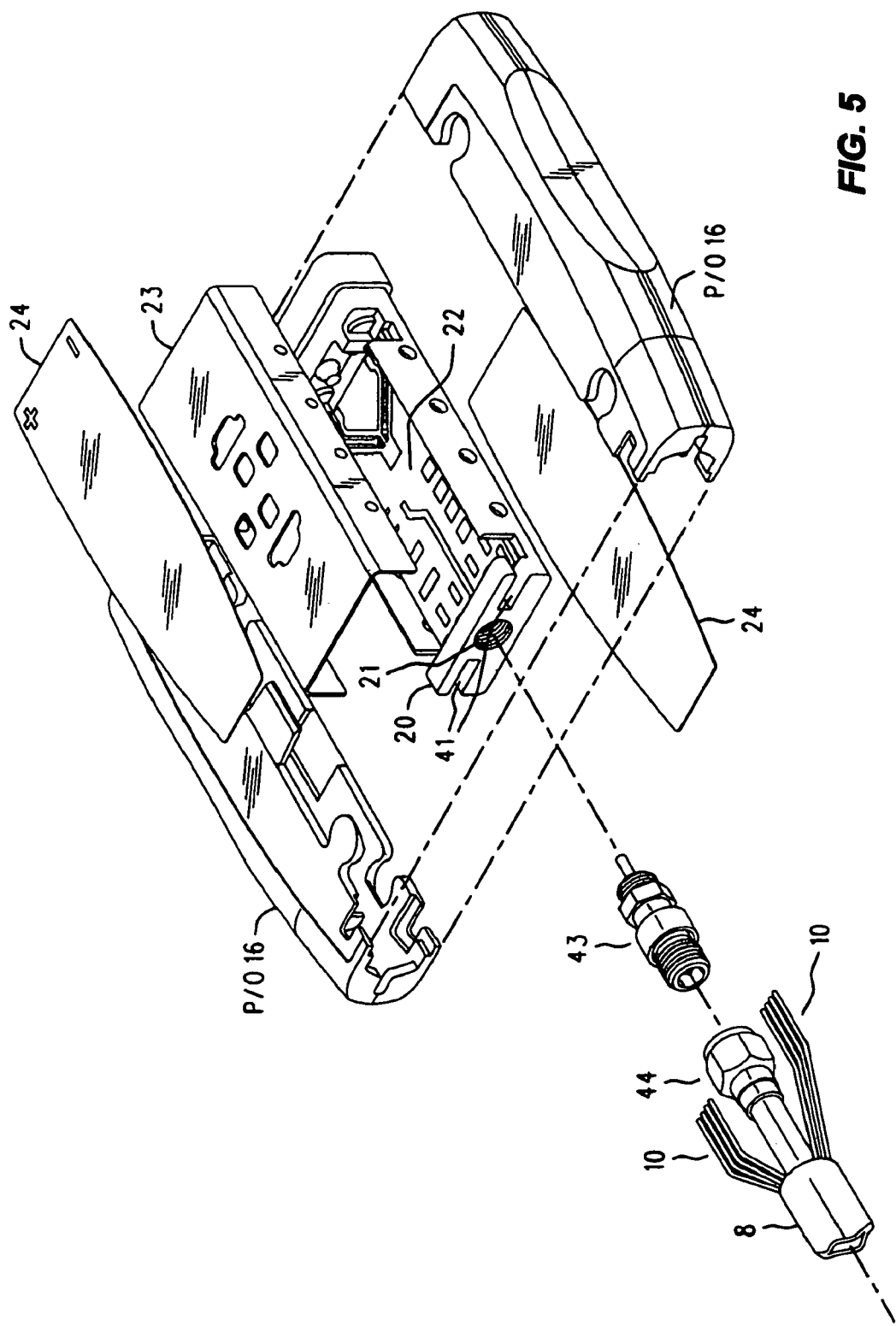
FIG. 5 is an exploded perspective view of an alternate embodiment of the active probe of FIG. 1.

Finally, it will be appreciated that it is not absolutely necessary to use as the detachable coaxial connection in the probe itself the particular soldered-to-the-shield connector with soldered center conductor that is shown and described in the incorporated '989 application. It would also be possible to use another threaded connector, such as APC 3.5, or if sufficient additional strain relief is provided, even a conventional push-on RF connector, such as SMP, SMB or SMC. Refer to FIG. 5, and note 43 and 44. It might be desirable for the auxiliary conductors at the probe to remain soldered if space is at a premium (which seems likely). By the same token, the RF connector assembly 34 of the positive locking push-on precision male BNC connector assembly 3 (pod housing) could also be a non-threaded RF connector.

It will be appreciated that, since SMA mates with APC 3.5, and is outwardly generally identical to APC 3.5, all references herein, including in the claims that follow, to APC 3.5 will be understood as being also to SMA.

I claim:

1. Probe apparatus for an electronic instrument comprising:
   a first housing containing a push-on connector that mates with a panel mounted connector on the electronic instrument and that has detents that automatically engage when the push-on connector is mated to the panel mounted connector, a nonautomatic-mating end of the push-on connecter having a first RF connector;
   a second housing containing a probe assembly for probing a signal of interest and also a second RF connector which carries a probed signal;
   a cable having a signal transmission portion and to which is coupled at one end a third RF connector and a fourth RF connector at the other; and
   the first and third RF connectors being mated together within the first housing and the second and fourth RF connectors being mated together within the second housing.

2. Probe apparatus as in claim 1 wherein the signal transmission portion of the cable is a coaxial transmission line having a characteristic impedance, and the push-on connector and the first through fourth RF connectors are each coaxial and of the same characteristic impedance as the signal transmission portion of the cable.

3. Probe apparatus as in claim 1 wherein the push-on connector is BNC.

4. Probe apparatus as in claim 1 wherein the first and third RF connectors are APC 3.5.

5. Probe apparatus as in claim 1 wherein the second and fourth RF connectors are APC 3.5.

6. Probe apparatus as in claim 1 wherein the first and third RF connectors are non-threaded connectors.

7. Probe apparatus as in claim 1 wherein the second and fourth RF connectors are non-threaded connectors.

8. Probe apparatus for an electronic instrument comprising:
- a first housing containing a push-on connector that mates with a panel mounted connector on the electronic instrument and that has detents that automatically engage when the push-on connector is mated to the panel mounted connector, a nonautomatic-mating end of the push-on connecter having a first RF connector;
- a second housing containing a probe assembly for probing a signal of interest and also a threaded bore for receiving an RF connector which carries a probed signal;
- a cable having a signal transmission portion and to which is coupled at one end a second RF connector and a third RF connector at the other; and the first and second RF connectors being mated together within the first housing and the third RF connector being mated to the threaded bore within the second housing.

9. Probe apparatus as in claim 8 wherein the signal transmission portion of the cable is a coaxial transmission line having a characteristic impedance, and the push-on connector and the first through third RF connectors are each coaxial and of the same characteristic impedance as the signal transmission portion of the cable.

10. Probe apparatus as in claim 8 wherein the push-on connector is BNC.

11. Probe apparatus as in claim 8 wherein the first and second RF connectors are APC 3.5.

12. Probe apparatus as in claim 8 wherein the first and second RF connectors are non-threaded connectors.

* * * * *